(12) United States Patent
Park

(10) Patent No.: US 6,933,083 B2
(45) Date of Patent: Aug. 23, 2005

(54) METHOD OF DESIGNING PHASE GRATING PATTERN FOR USE IN MODIFYING ILLUMINATION IN AN EXPOSURE PROCESS, AND METHOD OF MANUFACTURING A PHOTO MASK SYSTEM HAVING THE PHASE GRATING PATTERN

(75) Inventor: Jong-Rak Park, Cheongju (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 218 days.

(21) Appl. No.: 10/384,540

(22) Filed: Mar. 11, 2003

(65) Prior Publication Data

US 2003/0235766 A1 Dec. 25, 2003

(30) Foreign Application Priority Data

Jun. 22, 2002 (KR) ................. 10-2002-0035171

(51) Int. Cl.$^7$ ............. G03F 9/00; G06F 17/50
(52) U.S. Cl. ............. 430/5; 716/21
(58) Field of Search ........... 430/5, 322, 323, 430/324; 716/19, 21

(56) References Cited

U.S. PATENT DOCUMENTS 6,037,082 A * 3/2000 Capodieci ............. 430/5
6,057,065 A  5/2000 Rolson ............. 430/5

* cited by examiner

Primary Examiner—S. Rosasco
(74) Attorney, Agent, or Firm—Volentine Francos & Whitt, PLLC

(57) ABSTRACT

A method of designing a phase grating pattern and a method of manufacturing a photo mask using the design method are aimed at enhancing the resolution of a photolithographic process. A modified form of illumination, which will irradiate a main mask pattern to be transcribed onto a wafer using the photolithographic process and thereby enhance the transcription process, is selected. An area over which patterns for providing the modified form of illumination is divided into a plurality of subcells. Phase values are arbitrarily assigned and a phase values to the subcells. One of the subcells is randomly selected, and a phase value is assigned to the randomly selected subcell. These steps are repeated producing new arrangements of the phase values assigned to the subcells. The arrangements of the phase values are evaluated to determine whether any of them correspond to the selected modified illumination. When such a correspondence is realized, a phase grating pattern made according to the arrangement of phase values is produced as part of an auxiliary mask or as part of the main mask.

20 Claims, 5 Drawing Sheets

METHOD OF DESIGNING PHASE GRATING PATTERN FOR USE IN MODIFYING ILLUMINATION IN AN EXPOSURE PROCESS, AND METHOD OF MANUFACTURING A PHOTO MASK SYSTEM HAVING THE PHASE GRATING PATTERN

BACKGROUND OF THE INVENTION

1. Field of the Invention

The present invention relates to a photolithographic process used in semiconductor manufacturing. More particularly, the present invention relates to a phase grating pattern used to produce modified illumination in a photo mask system and to a method of manufacturing a photo mask system having the phase grating pattern.

2. Description of the Related Art

A photolithographic process is used extensively to transfer pattern images in the manufacturing of semiconductor devices. However, the resolution of the photolithographic process must be increased to meet the current demand for semiconductor devices having higher and higher integration densities, i.e., to meet the demand for manufacturing semiconductor devices produced under smaller and smaller design rules. The resolution of the photolithographic process may be limitation by several factors, such as the wavelength of an exposure light source, the numerical aperture of a projection lens, the depth of focus, the process parameters, and the like. The need to increase the resolution of the photolithographic process, however, surpasses the limitations of current exposure apparatuses.

Attempts to overcome the limitations imposed by exposure apparatus on the resolution that can be achieved in a photolithographic process have included modifying the illumination systems of the apparatus and the introduction of phase shift masks. With respect to the latter, a grating has been added to a primary mask to diffract light transmitted through the primary mask, thereby modifying the illumination otherwise provided for the exposure process. Such grating-diffracted light causes a shift in the exposure energy illuminating the primary mask to provide an off-axis illumination of the primary mask. The resolution that is otherwise achievable using only the primary mask can thus be improved.

Such gratings up until now have been limited to simple line-space or simple mosaic types of gratings. For example, U.S. Pat. No. 6,057,065, issued May 2, 2000 to J. Brett Rolson, and entitled "Lithographic System Having Diffraction Grating and Attenuated Phase Shifters", discloses simple line-space grating patterns. Such grating patterns are basically composed of simple line-space or square mosaic forms of patterns and are thus limited to providing modified illumination corresponding to a simple dipole or quadrupole. Simple dipole or quadrupole modified illumination can only achieve a limited increase in the resolution of the photolithographic process.

Accordingly, there is a growing interest in finding a way to further increase the resolution and depth of focus of an exposure process through the use of modified illumination.

SUMMARY OF THE INVENTION

An object of the present invention is to provide a method of designing a phase grating pattern by which the illumination of a primary mask can be modified in order to increase the resolution of a photolithographic process in which the main pattern of the primary mask is transcribed onto a wafer.

According to one aspect of the present invention, a method of designing a phase grating pattern first involves selecting the form of the modified illumination which will be used to project the pattern of the primary mask onto a wafer in the photolithographic process. An area, in which at least part of the phase grating pattern for producing the modified illumination is to occupy, is divided into a plurality of subcells. Phase values are arbitrarily assigned as initial phase values to the subcells. Either the phase values are randomly assigned or an arbitrary one of the phase values is assigned to each of the subcells. One of the subcells is randomly selected and a phase value, preferably different form the previously assigned phase value, is newly assigned to the randomly selected subcell. These steps are repeated producing new arrangements of the phase values assigned to the subcells. The arrangements of the phase values are evaluated to determine whether any of them correspond to a phase grating pattern that will produce the desired modified illumination.

The area that is divided is preferably a unit of that which is to be occupied by the entire phase grating pattern. In this case, the portion of the phase grating pattern designed for the unit area is repeated to provide the final design of the phase grating pattern.

According to another aspect of the present invention, phase values are evaluated using a Fourier series derived based on the phase values. A Fourier-transform function is used to obtain a Fourier-transform function value based on the arrangement of phase values that are assigned to the subcells. A cost function value is then obtained as a correlation between the Fourier-transformed function value and a function value representing the intended modified form of illumination. The cost function value is evaluated to determine whether a current arrangement of the phase values assigned to the subcells corresponds to a phase grating pattern that will produce the intended modified form of illumination As steps of the process are repeated, the current cost function value is compared to the previous cost function value. The assignment of the new phase value to the selected one of the subcells is maintained throughout the remainder of the process if the current cost function value is less than the previous cost function value. On the other hand, the phase value assigned to the selected one of the subcells is changed back to the phase value previously assigned to the selected one of the subcells if the current cost function value is greater than the previous cost function value. Thus, the method is one of an iteration in which the cost function value converges toward a prescribed value, such as zero, representing the number of times the steps must be repeated to establish an arrangement of phase values that correspond to a phase grating which will produce the intended modified illumination.

According to a still another aspect of the present invention, a method of manufacturing a photo mask includes providing a main mask bearing a main pattern the image of which is to be transcribed onto a substrate (wafer), selecting a modified form of illumination of the main mask intended to enhance the transcribing of the image of the main pattern onto the substrate, designing a phase grating pattern according to the above-described aspect(s) of the invention, and producing a mask system in which the designed phase grating pattern is integrated with the main mask.

The phase grating pattern may be formed on a surface of the primary mask opposite that on which the main mask pattern of the primary mask is formed. Alternatively, the phase grating pattern may be formed on a substrate discrete from that of the primary mask to thereby form an auxiliary mask. In this case, the auxiliary mask and the primary mask are interposed.

The phase grating pattern is formed by etching the auxiliary or primary mask substrate to form regions having depths that will induce phase shifts in light transmitted therethrough, the regions and the phase shifts corresponding to the locations and magnitudes of the phase values assigned to the subcells in the final design of the phase grating pattern.

According to the present invention, even though conventional illumination is used as an exposure light source, the light emitted by the light source can be modified to realize practically any form of illumination at the mask level. Thus, the resolution or depth of focus achieved in a photolithographic process can be improved.

BRIEF DESCRIPTION OF THE DRAWINGS

The above and other objects, features and advantages of the present invention will become more apparent from the following detailed description of the preferred embodiments thereof made with reference to the attached drawings, in which.

DETAILED DESCRIPTION OF THE PREFERRED EMBODIMENTS

Figure 1:
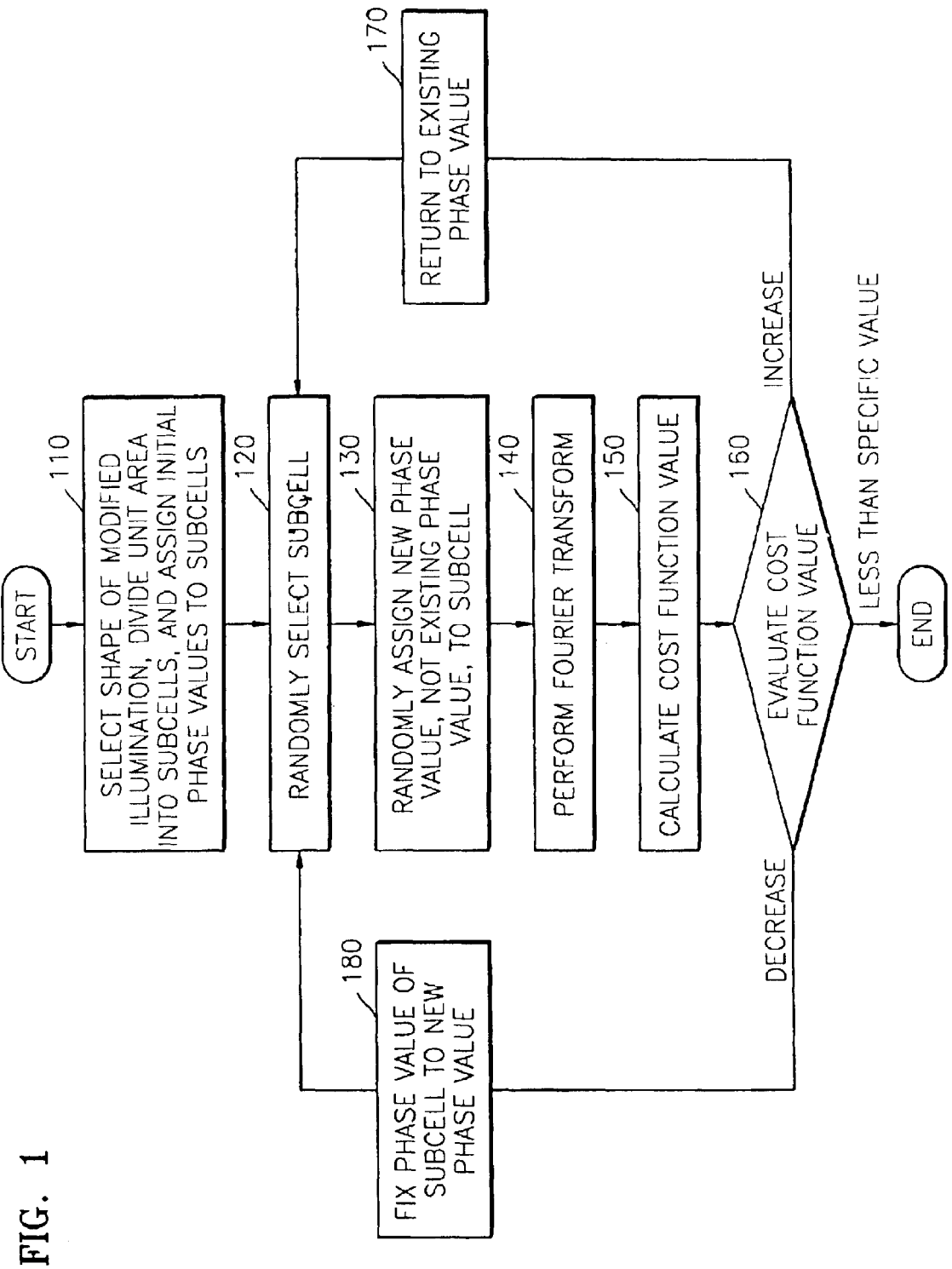
FIG. 1 is a flowchart of an embodiment of a method of designing a phase grating pattern providing modified illumination according to the present invention.

The present invention will be described in detail hereinafter with reference to the attached drawings. In the drawings, the thicknesses of layers or regions are exaggerated for clarity. Also, like reference numerals denote like elements throughout the drawings.

The present invention provides a method of designing a phase grating pattern used to modify the illumination of a primary mask that bears a pattern to be transcribed onto a semiconductor substrate. The phase grating pattern may be realized on a surface of the primary mask opposite that on which the pattern to be transcribed is formed or may be realized on an auxiliary mask. The resulting phase grating serves to diffract light passing therethrough to modify the illumination of the pattern of the primary mask which is to be transcribed. The modified illumination may have any form deemed by the designer to be necessary or desirable for the photolithographic process. For example, the form of the modified illumination may be an octapole, annular shape or asymmetrical.

Figure 2:
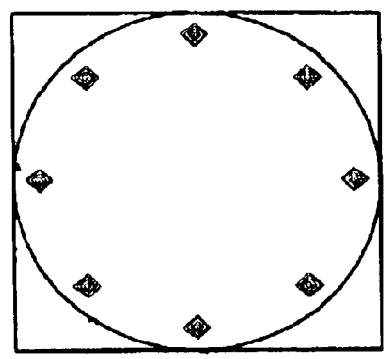
FIG. 2 is a diagram of octapole-shaped illumination as an example of the modified illumination desired to be realized by a phase grating pattern designed according to the method of the present invention illustrated by the flowchart of FIG. 1.

Referring now to FIG. 1, in step 110, the form of the modified illumination is selected. For example, as shown in FIG. 2, an octapole-shaped form for the modified illumination to be provided by the phase grating is selected. The form of the octapole-shaped illumination may be expressed as coordinates in space. After the form of modified illumination to be realized is set, a portion of a target area, in which a phase grating pattern providing such modified illumination is to be formed, is assigned as a unit area. In this case, the portion of the phase grating pattern established in this unit area will be repeated throughout the entire target area to realize the overall form of the phase grating pattern. This simplifies the design process. However, the phase grating pattern may be designed at once for the entire target area, i.e., without the use of unit areas. Next, in step 110, the unit area is divided into subcells.

Figure 3:
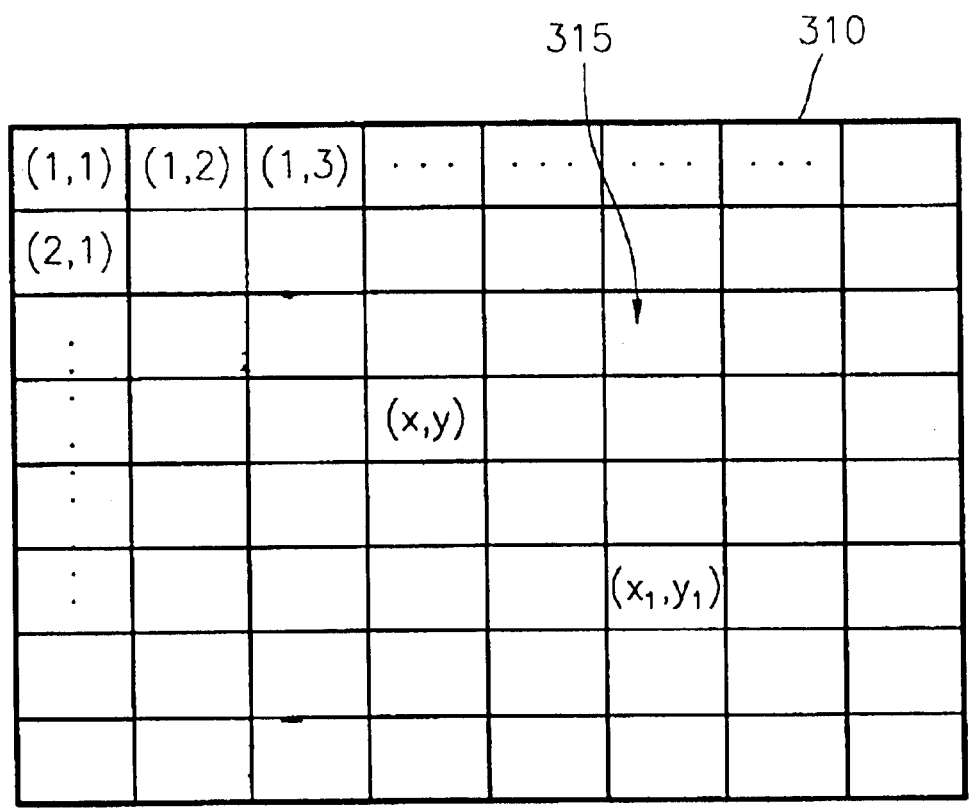
FIG. 3 is a diagram of a unit area, divided into subcells, used in the method of the present invention illustrated by the flowchart of FIG. 1.

FIG. 3 is a schematic diagram of the unit area 310 divided into subcells 315. Each of the subcells 315 may be expressed as a predetermined coordinate in space. For example, each of the subcells 315 may be designated as a respective x, y coordinate. Also, the unit area 310 may be divided into subcells 315 of an arbitrary size and number. For example, the unit area 310 may be divided into m rows and into n columns such that the unit area 310 has m×n subcells 315. Here, each of the subcells 315 is very small, e.g., has a maximum width of about 200 nm. In the case of an exposure apparatus that provides a reduction in scale of 1:4 with respect to the image formed by the exposure light, each of the subcells 315 corresponds to an image of about 50 nm that is projected onto an actual wafer.

Referring back to FIG. 1, in step 110, initial phase values are assigned to the respective subcells 315. It is preferable that the assigned initial phase values respectively indicate the degrees to which the phase of the exposure light will be shifted by portions of the phase grating corresponding to the subcells 315. If the phase shift grating is to induce a phase difference of 180° between respective light rays passing therethrough, initial phase values of 0° and 180° may be arbitrarily assigned to the subcells 315. However, phase values of 0°, 90°, 180°, and 270° may be assigned so that smaller phase differences can be produced if desired. Nevertheless, the present invention will be described with respect to the use of initial phase values of 0° and 180° for the sake of simplicity.

A phase value of 0° (or 180°) may be specifically assigned to each of the subcells 315 as an initial phase value. Alternatively, phase values of 0° and 180° may be randomly assigned to the subcells using a random generator. If so, an initial phase value in one of the subcells 315 at an arbitrary position (x, y) may be 0° (or 180°) whereas the same initial phase value may be assigned to the other subcells 315. Although the technique of assigning the initial phase values to the subcells 315 is related to the speed of the entire design process it does not substantially affect the result of the design process.

After the initial phase values are assigned to the subcells 315, an arbitrary subcell is selected at random from amongst the subcells 315 (step 120 of FIG. 1). For instance, the subcell at position (x, y) shown in FIG. 3 is selected.

Thereafter, a new phase value that is different from the existing phase value is assigned to the selected subcell, i.e., the subcell at position (x, y) (step 130 of FIG. 1). For example, if an initial phase value of 0° had been assigned to the subcell at position (x, y), a new phase value of 180° is assigned to the subcell at position (x, y). The new phase value is determined by randomly selecting a phase value that is different from the initial existing phase value. For instance, when the phase values to be assigned consist of 0° and 180°, a new phase value of 180° is thus assigned to the subcell at position (x, y). On the other hand, when the phase values to be assigned are 0°, 90°, 180°, and 270°, one of the three phase values other than the initial assigned phase value 0° is randomly assigned to the subcell at position (x, y). This reassigning of the phase values may be performed employing a random flip process. The particular process or technique of reassigning phase values to the subcells 315 may affect the speed at which the design process converges on the optimal design for phase grating pattern but does not affect the result of the design of the phase grating pattern.

After a new phase value is assigned to the subcell 315, a phase grating pattern based on the arrangement of the phase values for the subcells 315 in the unit area 310 is evaluated with respect to the modified illumination selected in step 110. The phase grating pattern and the form of the modified illumination produced by the phase grating pattern are related to a Fourier series. In other words, the form of the modified illumination that can be realized by a phase grating pattern can be determined by Fourier-transforming frequency values corresponding to the current phase values as correlated to the positions of the subcells to which the current phase values are assigned.

Accordingly, in order to evaluate modified illumination which can be produced using the phase grating pattern designed according to the current phase values, frequency values corresponding to the current phase values are Fourier-transformed (step 140 of FIG. 1). The Fourier transform may be a fast Fourier transform (FFT) algorithm. In other words, the form of the modified illumination that can be produced using a phase grating pattern, designed according to the current phase values, is determined using a Fourier transform. Then, the form of the modified illumination is compared with the form of the modified illumination set in the initial stage of the process. The process of evaluating the phase grating patterns using a Fourier series may employ various methods used in connection with the photolithographic process employed in the semiconductor field.

This comparison is performed by first deriving a cost function from the difference between transformed values (in the form of a spatial frequency function) obtained from the Fourier transform and frequency function values representing the form of the modified illumination set in the initial stage, calculating a cost function value using the cost function (step 150 in FIG. 1), and then evaluating the cost function value (step 160 in FIG. 1). If the calculated cost function value is less than a specific predetermined value, a phase grating pattern produced according to the phase values currently assigned to the subcells is regarded as suitable for providing the intended modified illumination. Thus, the process of designing the phase grating patterns is complete.

However, it is very unlikely that the design based on the initially-assigned phase values would result in a phase grating pattern producing the intended modified illumination. That is, the probability of realizing the set modified illumination on the basis of the initially assigned phase values is very low. Therefore, as long as the cost function value is not less than the specific predetermined value, the steps of randomly selecting a subcell through evaluating the cost function value, i.e., steps 120 through 160 in FIG. 1, are repeated in sequence.

More specifically, the phase value assigned to one of the subcells 315 is changed while the phase values assigned to the other subcells are maintained until the cost function value is calculated. For example, as shown in FIG. 3, if the subcell 315 now selected is at position $(x_1, y_1)$ and a phase value of 0° was assigned to the subcell, the subcell at position $(x_1, y_1)$ is assigned a new phase value of 180° (step 130). A phase grating pattern made according to this new arrangement of phase values of the subcells is Fourier-transformed (step 140 in FIG. 1), and a new cost function value is calculated (step 150 in FIG. 1).

The current cost function value is compared with the previously calculated cost function value and is evaluated (step 160 in FIG. 1). If the current cost function value is less than a specific value, the design process stops because a phase grating pattern made on the basis of the current phase values is regarded as one that will produce the desired modified illumination. However, if the current cost function value is greater than the specific value, steps 120 through 160 in FIG. 1 are repeated.

As described above, in an attempt to converge the new cost function value, obtained as the result of repeating the above-described steps, towards one that will be equal to or less than a specific predetermined value, the phase value assigned to the subcell randomly selected in step 120 is changed. In the current example, a new phase value of 180°, not the original value of 0°, is assigned to the subcell at position $(x_1, y_1)$ in step 130. However, if the cost function value calculated in step 150 of FIG. 1 is higher than the previously calculated cost function value (step 160), the subcell at position $(x_1, y_1)$ is assigned its original phase value of 0° when the process returns to step 120 (step 170 in FIG. 1). On the other hand, of course, if the cost function value calculated in step 150 is determined in step 160 to be less than the previous cost function value but still greater than the specific predetermined value, when the process returns to step 120, the phase value of the subcell at position $(x_1, y_1)$ is fixed at 180° (step 180 in FIG. 1).

As steps 170 and 180 are continuously performed in the loop of the process of sequentially repeating step 120 (randomly selecting a subcell) through step 160 (evaluating the cost function value), the cost function value will gradually converge on (decrease to) a specific predetermined value, e.g., zero. However, it may be difficult to get the cost function value to converge exactly to zero. Accordingly, the specific predetermined value, which is a basis of determining when the process is to be stopped, may be set to a value corresponding to a point of convergence of a curve representing changes in the cost function value and the number of times the process (loop) is repeated.

Figure 4:
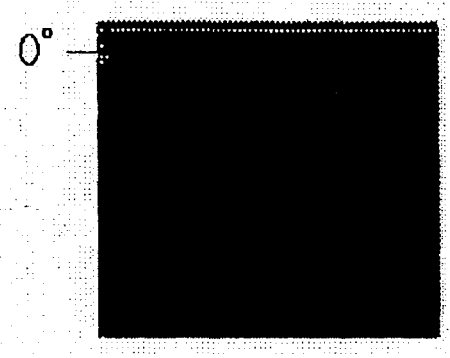
FIG. 4 is a diagram of a portion of a phase grating pattern produced in a case in which a final phase value of 0° is assigned to all subcells in the method shown in FIG. 1.
Figure 5:
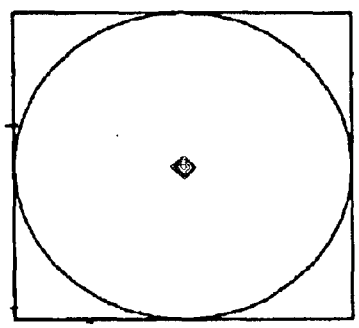
FIG. 5 is a diagram of a Fourier-transform spectrum associated with the pattern shown in FIG. 4, namely when a phase value of 0° is assigned to all of the subcells.

FIG. 2 shows the form of the modified illumination when it is that of an octapole. On the other hand, FIG. 4 shows the case in which the phase value of 0° is assigned to all of the subcells as a result of performing steps 110 through 130. When a phase grating pattern composed of unit areas divided into such subcells is modelled as a Fourier series, the Fourier series (frequency function) as represented in space, i.e., the form of the modified illumination that will be produced by the phase grating pattern, is shown in FIG. 5. Note, in this case, the light source to be used in the modelling of the intended illumination to be provided by the phase grating pattern is assumed to be conventional.

If the present process were carried out using a phase grating pattern having the phase values shown in FIG. 4 (all 0°), and the form of the intended modified illumination was that of the octapole shown in FIG. 2, the cost function value obtained in step 150 would naturally be a very large value. This means that the intended modified illumination shown in FIG. 2 would not be produced by simply employing the phase grating pattern shown in FIG. 4 in the exposure apparatus.

Figure 6:
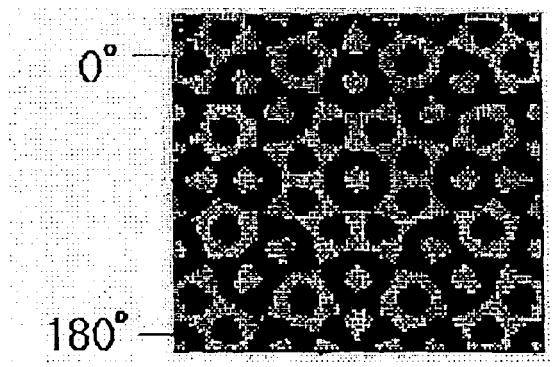
FIG. 6 is a plan view of a phase grating pattern obtained by randomly assigning phase values of 0° or 180° to the subcells and carrying out the method according to the flowchart of FIG. 1.

Nonetheless, by carrying out the process of FIG. 1 on the phase grating pattern shown in FIG. 4, eventually a final phase grating pattern having a cost function value that is less than or equal to the specific predetermined value is obtained. An example of a final phase grating pattern obtained through this process is shown in FIG. 6. In this example, the phase values to be assigned to the subcells were limited to 0° and 180°. Also, the phase grating pattern shown in FIG. 6 is composed of predetermined unit areas that are repeated throughout the pattern.

Figure 7:
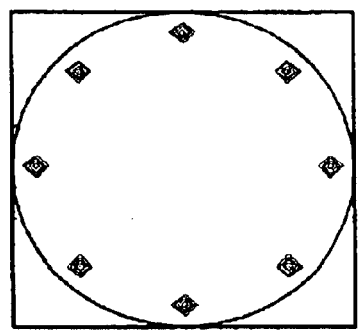
FIG. 7 is a schematic diagram of a Fourier-transform spectrum corresponding to the phase grating pattern shown in FIG. 6.

FIG. 7 shows the Fourier-transform spectrum of the phase grating pattern shown in FIG. 6, produced when the phase grating pattern shown in FIG. 6 is Fourier-transformed and the resulting frequency function value is illustrated. As can be seen from the figures, the shape of the spectrum shown in FIG. 7 is substantially identical to the shape of the intended form of the modified illumination shown in FIG. 2.

As was mentioned above, in the example made with reference to FIGS. 4 through 7, the phase values to be assigned to the subcells were limited to 0° and 180°. However, a phase grating pattern realizing a more precise modified illumination can be designed by using a greater number of phase values to be assigned to the subcells. For example, as was also previously mentioned, phase values of 0°, 90°, 180°, and 270° may be randomly assigned to the subcells. In this case, a phase grating pattern and a Fourier-transform spectrum realized through the steps of FIG. 1 are shown in FIGS. 8 and 9, respectively.

Figure 10:
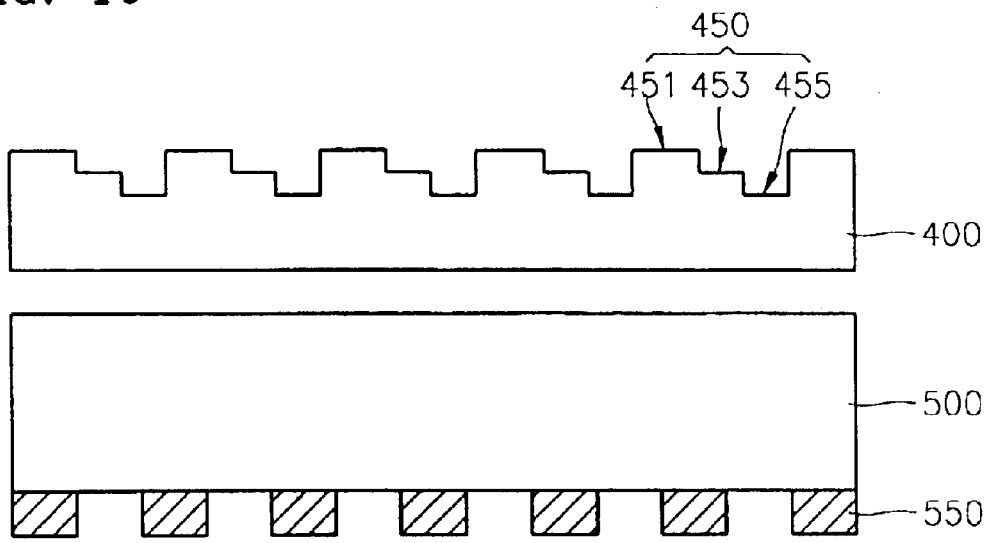
FIGS. 10 through 12 are cross-sectional views of respective photomask systems according to the present invention.
Figure 11:
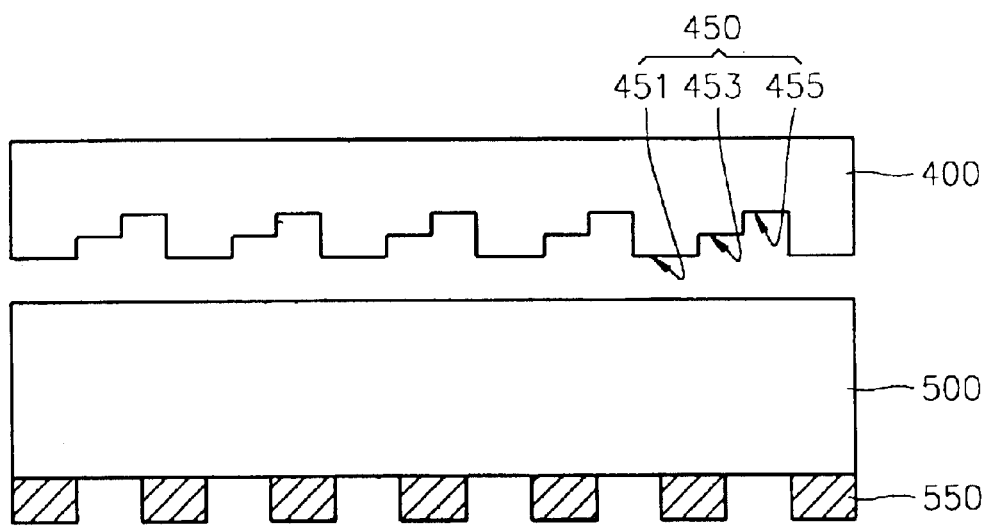

A phase grating pattern designed according to the above-described process may be produced on a surface of an auxiliary mask, as shown in FIGS. 10 and 11.

Figure 8:
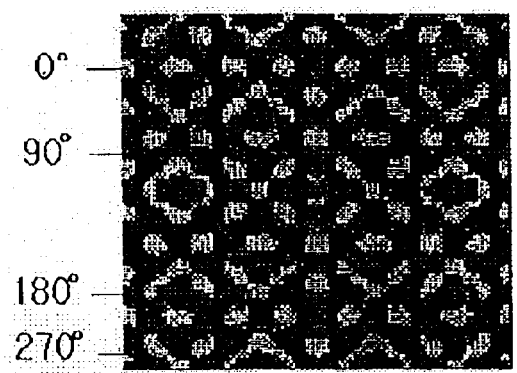
FIG. 8 is a plan view of a phase grating pattern obtained by first arbitrarily assigning phase values of 0°, 90°, 180°, or 270° to subcells using a design method according to the present invention.
Figure 9:
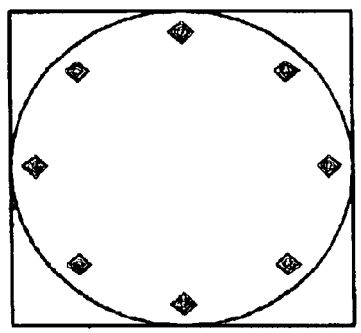
FIG. 9 is a schematic diagram of a Fourier-transform spectrum corresponding to the phase grating pattern shown in FIG. 8.

Referring to FIG. 10, an auxiliary mask 400 having a phase grating pattern 450 designed according to the steps shown in FIG. 1 (as shown in FIG. 6 or 8, for example) may be employed in a mask system used in the photolithographic process. The phase grating pattern 450 is formed on one surface of the auxiliary mask 400. The phase values that were finally assigned to the subcells are realized as respective depths of recesses formed in the auxiliary mask 400 by etching. For example, a first area 451 of the phase grating pattern 450 is realized as an unetched area corresponding to a phase value of 0°, a second area 453 of the phase grating pattern 450 is realized as an area etched to a predetermined depth corresponding to a phase value of 90°, and a third area 455 of the phase grating pattern 450 is realized an area etched to a different predetermined depth corresponding to a phase value of 180°.

Also, in the example shown in FIG. 10, the surface of the auxiliary mask 400 bearing the phase grating pattern 450 is arranged to face in a direction opposite to that of a surface of a primary mask 500 bearing the primary mask pattern 550 to be transferred to a substrate. The phase grating pattern 450 of the auxiliary mask 400 serves to modify the illumination transmitted to the primary mask pattern 550 from the light source of the exposure apparatus. Thus, if the phase grating pattern 450 of the auxiliary mask 400 is designed so as to produce the octapole-shaped illumination as shown in FIG. 6 or 8, the primary mask pattern 500 is irradiated with the octapole-shaped illumination.

FIG. 11 illustrates a second example of the photo mask according to the embodiment of the present invention. Referring to FIG. 11, the phase grating pattern 450 of the auxiliary mask 450 faces in the same direction as the surface of the primary mask 500 bearing the primary mask pattern 550.

Figure 12:
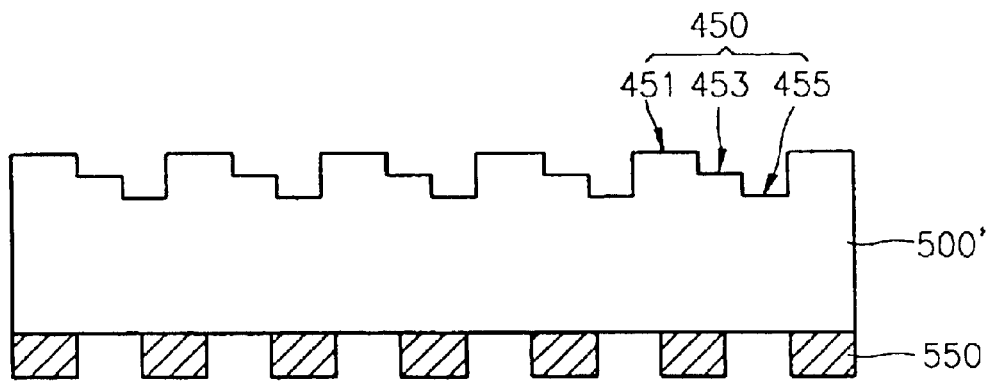

FIG. 12 illustrates a third example of a photo mask according to the present invention. Referring to FIG. 12, the phase grating pattern 450 may be realized on the surface of a primary mask 500' opposite to the surface on which the primary mask pattern 550 of the primary mask 500' is formed. In other words, the phase grating pattern may be integrated with the primary mask so that it forms a single body with the primary mask. In this case, similar to the previous embodiments, the phase grating pattern 450 is produced through a process of selectively etching the back surface of the primary mask 500'.

As described above, according to the present invention, various desired forms of modified illumination can be realized on a mask system level. Thus, the resolution and depth of focus of a pattern to be transferred can be increased without modifying a light exposure apparatus having a conventional system of illumination. Hence, the present invention can provide a very high process margin in the photolithographic process used in the manufacturing of semiconductor devices.

Finally, although the present invention has been particularly shown and described with reference to the preferred embodiments thereof, it will be understood by those of ordinary skill in the art that various changes in form and details may be made thereto without departing from the true spirit and scope of the present invention as defined by the appended claims.

What is claimed is:

1. A method of designing a phase grating pattern, the method comprising:

selecting an intended modified form of illumination that the phase grating is to provide in a photolithographic process;

dividing an area, over which at least one portion of the phase grating pattern is to occupy, into a plurality of subcells;

arbitrarily assigning one of a plurality of phase values to the subcells, whereby each of the subcells is provided with an initial one of the phase values, each of the phase values representing a respective phase shift that exposure light of the photolithographic process will undergo by being transmitted through a region of the phase pattern grating corresponding to the subcell;

randomly selecting one of the subcells, and assigning one of the plurality of the phase values to the selected one of the subcells, and repeating said random selecting of respective ones of the subcells and said assigning of one of the phase values thereto such that a plurality of arrangements of phase values assigned to the subcells are produced; and evaluating each different one of the plurality of arrangements of phase values with respect to the propensity of a phase grating pattern, based on the arrangement of phase values, to produce a form of modified illumination corresponding to the intended modified form of illumination.

2. The method of claim 1, wherein the area divided is only a unit area of that which is to be occupied by the entire phase grating pattern, and the portion of the phase grating pattern designed for said unit area is repeated to provide the final design of the phase grating pattern.

3. The method of claim 1, wherein said arbitrarily assigning one of a plurality of phase values to the subcells comprises randomly assigning the phase values to the subcells.

4. The method of claim 1, wherein said arbitrarily assigning one of a plurality of phase values to the subcells comprises assigning the same one of the phase values initially to all of the subcells.

5. The method of claim 1, wherein said arbitrarily assigning one of a plurality of phase values to the subcells comprises assigning each of the subcells a phase value selected from among the group consisting of phase values of 0° and 180°.

6. The method of claim 1, wherein said arbitrarily assigning one of a plurality of phase values to the subcells comprises assigning each of the subcells a phase value selected from among the group comprising phase values of 0°, 90°, 180°, and 270°.

7. The method of claim 1, wherein said assigning one of the plurality of the phase values to the selected one of the subcells comprises changing the phase value previously assigned to the selected one of the subcells to one of the phase values that is different from the phase value that had been last assigned thereto.

8. The method of claim 1, wherein said evaluating each of the different arrangements of the phase values is carried out each time the selected one of the subcells is assigned a phase value different from that which it had been last assigned, and before said another one of the subcells is randomly selected.

9. A method of designing a phase grating pattern, the method comprising:

selecting an intended modified form of illumination that the phase grating is to provide in a photolithographic process;

dividing an area, over which at least one portion of the phase grating pattern is to occupy, into a plurality of subcells;

arbitrarily assigning one of a plurality of phase values to the subcells, whereby each of the subcells is provided with an initial one of the phase values, each of the phase values representing a respective phase shift that exposure light of the photolithographic process will undergo by being transmitted through a region of the phase pattern grating corresponding to the subcell;

(a) randomly selecting one of the subcells;

(b) changing the phase value previously assigned to the selected one of the subcells to a new one of the phase values that is different from the phase value that had been last assigned thereto, whereby a new arrangement of the phase values assigned to the subcells is produced;

(c) using a Fourier-transform function to obtain a Fourier-transform function value based on the new arrangement of phase values that are assigned to the subcells;

(d) obtaining a cost function value as a correlation between the Fourier-transformed function value and a function value representing the intended modified form of illumination;

(e) evaluating the cost function value to determine whether the new arrangement of the phase values assigned to the subcells corresponds to the intended modified form of illumination; and (f) repeating steps (a)–(e) until a new arrangement of the phase values corresponds to a phase grating pattern that will produce the intended form of the modified illumination.

10. The method of claim 9, wherein said evaluating of the cost function value in (e) includes comparing a current cost function value obtained in (d) as the result of said repeating of (a)–(e) to the previous cost function value obtained in (d), and further comprising (g) maintaining the assignment of said new one of the phase values to the selected one of the subcells throughout the remainder of times that (a)–(e) are repeated if the current cost function value is less than the previous cost function value, and changing the phase value assigned to the selected one of the subcells to the phase value previously assigned to the selected one of the subcells if the current cost function value is greater than the previous cost function value.

11. The method of claim 9, wherein the area divided is only a unit area of that which is to be occupied by the entire phase grating pattern, and the portion of the phase grating pattern designed for said unit area is repeated to provide the final design of the phase grating pattern.

12. The method of claim 9, wherein said arbitrarily assigning one of a plurality of phase values to the subcells comprises randomly assigning the phase values to the subcells.

13. The method of claim 9, wherein said arbitrarily assigning one of a plurality of phase values to the subcells comprises assigning the same one of the phase values initially to all of the subcells.

14. The method of claim 9, wherein said arbitrarily assigning one of a plurality of phase values to the subcells comprises assigning each of the subcells a phase value selected from among the group consisting of phase values of 0° and 180°.

15. The method of claim 9, wherein said arbitrarily assigning one of a plurality of phase values to the subcells comprises assigning each of the subcells a phase value selected from among the group comprising phase values of 0°, 90°, 180°, and 270°.

16. A method of manufacturing a photo mask, the method comprising:

providing a main mask bearing a main pattern the image of which is to be transcribed onto a substrate using a photolithographic process in which the substrate is irradiated with light emitted by a light source and directed through the main mask;

selecting a form of illumination of the main mask intended to enhance the transcribing of the image of the main pattern onto the substrate;

designing a phase grating pattern that will modify the illumination of the main pattern with the light from the light source such that the main pattern will be irradiated with the selected form of illumination when light is directed onto the main pattern through the phase grating pattern, said designing comprising:

dividing an area, over which at least one portion of the phase grating pattern is to occupy, into a plurality of subcells, arbitrarily assigning one of a plurality of phase values to the subcells, whereby each of the subcells is provided with an initial one of the phase values, each of the phase values representing a respective phase shift that exposure light of the photolithographic process will undergo by being transmitted through a region of the phase grating pattern corresponding to the subcell, randomly selecting one of the subcells, changing the phase value last assigned to the selected one of the subcells to a new one of the phase values that is different from the phase value that had last been assigned thereto, whereby a new arrangement of the phase values assigned to the subcells is produced, establishing a correlation between the new arrangement of the phase values assigned to the subcells and the selected form of illumination that is intended to be transmitted by a phase grating pattern made according to said new arrangement of the subcells, using said correlation to determine whether the new arrangement of the phase values assigned to the subcells corresponds to the intended form of illumination, and repeating said randomly selecting one of the subcells, said changing of the phase value last assigned to the selected one of the subcells, and said using the correlation, until the new arrangement of the phase values assigned to the subcells is determined by said correlation to correspond to the intended form of illumination, whereupon the new arrangement of phase values is considered final; and producing a mask system in which a phase grating pattern inducing phase shifts in light transmitted therethrough, corresponding to the final arrangement of the phase values, is integrated with the main mask.

17. The method of claim 16, wherein said producing a mask system comprises forming the phase grating pattern on an auxiliary substrate discrete from said main mask to thereby form an auxiliary mask, and juxtaposing the auxiliary mask and the primary mask.

18. The method of claim 17, wherein said forming the phase grating pattern comprises etching the auxiliary substrate to form a series of recesses in a surface thereof.

19. The method of claim 16, wherein said producing a mask system comprises forming the phase grating pattern on one surface of a substrate of the main mask opposite another surface of the main mask that bears the main pattern the image of which is to be transcribed.

20. The method of claim 19, wherein said forming the phase grating pattern comprises etching said one surface of the substrate of the main mask to form a series of recesses therein, whereby the phase grating pattern and said main pattern are parts of unitary body.

* * * * *